(12) United States Patent
Hartog

(10) Patent No.: US 7,104,578 B2
(45) Date of Patent: Sep. 12, 2006

(54) TWO LEVEL END EFFECTOR

(75) Inventor: Edwin Den Hartog, Utrecht (NL)

(73) Assignee: ASM International N.V., Bilthoven (NL)

( * ) Notice: Subject to any disclaimer, the term of this patent is extended or adjusted under 35 U.S.C. 154(b) by 189 days.

(21) Appl. No.: 10/361,480

(22) Filed: Feb. 5, 2003

(65) Prior Publication Data

US 2003/0173790 A1 Sep. 18, 2003

Related U.S. Application Data

(60) Provisional application No. 60/377,904, filed on May 2, 2002, provisional application No. 60/365,122, filed on Mar. 15, 2002, provisional application No. 60/379,885, filed on May 10, 2002.

(51) Int. Cl.
*B65G 49/07* (2006.01)

(52) U.S. Cl. .................... 294/64.1; 294/1.1; 414/941

(58) Field of Classification Search ............... 294/1.1, 294/64.1, 64.2, 64.3; 414/935, 941, 226.01, 414/752.1; 901/40
See application file for complete search history.

(56) References Cited

U.S. PATENT DOCUMENTS

| 3,466,079 A | 9/1969 | Mammel |
| 3,523,706 A | 8/1970 | Logue |
| 3,947,236 A | 3/1976 | Lasch, Jr. |
| 4,348,044 A | 9/1982 | Wood, III |
| 4,468,259 A | 8/1984 | Mimura |
| 4,495,024 A | 1/1985 | Bok |
| 4,575,408 A | 3/1986 | Bok |
| 4,586,743 A | 5/1986 | Edwards et al. |
| 4,738,748 A | 4/1988 | Kisa |
| 4,773,687 A | 9/1988 | Bush et al. |
| 4,852,247 A * | 8/1989 | Hawkswell ............ 29/740 |
| 4,860,687 A | 8/1989 | Frijlink |
| 4,900,214 A | 2/1990 | Ben |
| 4,904,012 A | 2/1990 | Nishiguchi et al. |
| 4,913,481 A | 4/1990 | Chin et al. |

(Continued)

FOREIGN PATENT DOCUMENTS

EP 0 405 301 1/1991

(Continued)

OTHER PUBLICATIONS

Provisional specification for 300-mm Front-opening Interface Mechanical Standard (FIMS), SEMI E62-0997, pp. 1-10.

(Continued)

*Primary Examiner*—Dean J. Kramer
(74) *Attorney, Agent, or Firm*—Knobbe, Martens, Olson & Bear, LLP

(57) ABSTRACT

An end effector alternately (or simultaneously) transports susceptors and wafers. Separate contact surfaces are provided for wafer transport and for susceptor transport. In one embodiment, the wafer contact surface is spaced above the susceptor contact surface, and the susceptor is a plate with a recess sized and deep enough to accommodate the wafer contact surface without touching it, while being supported upon the susceptor contact surface. The wafer contact surface is a complete or C-shaped ring having an annular opening connected to a vacuum pump. In another embodiment, the wafer contact surface is spaced below the susceptor contact surface, and both comprise peripheral edge support surfaces. The edge support surfaces can be formed from a single sloped surface for each contact pad, with a smaller wafer supported below the position of a larger susceptor plate. Alternatively, a stepped surface is provided for each pad, with the lower inner contact surfaces supporting a wafer and the upper outer contact surfaces supporting the susceptor.

12 Claims, 14 Drawing Sheets

U.S. PATENT DOCUMENTS

| | | | |
|---|---|---|---|
| 4,923,054 A | | 5/1990 | Ohtani et al. |
| 4,971,512 A | * | 11/1990 | Lee et al. ............... 414/744.8 |
| 5,022,695 A | | 6/1991 | Ayers |
| 5,133,635 A | | 7/1992 | Malin et al. |
| 5,162,047 A | | 11/1992 | Wada et al. |
| 5,445,486 A | * | 8/1995 | Kitayama et al. ...... 414/416.03 |
| 5,520,501 A | | 5/1996 | Kouno et al. |
| 5,565,034 A | | 10/1996 | Nanbu et al. |
| 5,592,581 A | | 1/1997 | Okase |
| 5,669,752 A | * | 9/1997 | Moon ........................ 414/783 |
| 5,692,873 A | * | 12/1997 | Weeks et al. ............... 414/627 |
| 5,711,811 A | | 1/1998 | Suntola et al. |
| 5,746,460 A | | 5/1998 | Marohl et al. |
| 5,762,391 A | | 6/1998 | Sumnitsch |
| 5,765,889 A | | 6/1998 | Nam et al. |
| 5,788,425 A | | 8/1998 | Skow et al. |
| 5,788,453 A | | 8/1998 | Donde et al. |
| 5,820,367 A | | 10/1998 | Osawa |
| 5,833,288 A | | 11/1998 | Itasaka |
| 5,839,770 A | | 11/1998 | Zajac, Jr. et al. |
| 5,851,041 A | | 12/1998 | Anderson et al. |
| 5,879,459 A | | 3/1999 | Gadgil et al. |
| 5,897,311 A | | 4/1999 | Nishi |
| 5,931,518 A | | 8/1999 | Pirker |
| 5,983,906 A | | 11/1999 | Zhao et al. |
| 5,984,607 A | | 11/1999 | Oosawa et al. |
| 5,990,650 A | | 11/1999 | Brock |
| 6,062,853 A | | 5/2000 | Shimazu et al. |
| 6,068,441 A | | 5/2000 | Raaijmakers et al. |
| 6,109,677 A | | 8/2000 | Anthony |
| 6,111,225 A | | 8/2000 | Ohkase et al. |
| 6,152,677 A | * | 11/2000 | Tateyama et al. ........... 414/738 |
| 6,158,951 A | | 12/2000 | Carr et al. |
| 6,167,322 A | | 12/2000 | Holbrooks |
| 6,168,668 B1 | | 1/2001 | Yudovsky |
| 6,183,183 B1 | | 2/2001 | Goodwin et al. |
| 6,189,943 B1 | | 2/2001 | Manpuku et al. |
| 6,204,194 B1 | | 3/2001 | Takagi |
| 6,244,641 B1 | * | 6/2001 | Szapucki et al. ........... 294/64.1 |
| 6,279,976 B1 | * | 8/2001 | Ball ........................... 294/64.1 |
| 6,280,183 B1 | | 8/2001 | Mayur et al. |
| 6,322,116 B1 | | 11/2001 | Stevens |
| 6,331,023 B1 | | 12/2001 | Goodwin et al. |
| 6,347,919 B1 | | 2/2002 | Ryan et al. |
| 6,368,049 B1 | | 4/2002 | Osaka et al. |
| 6,399,922 B1 | | 6/2002 | Okase et al. |
| 6,409,453 B1 | | 6/2002 | Brodine et al. |
| 6,462,411 B1 | | 10/2002 | Watanabe et al. |
| 6,559,039 B1 | | 5/2003 | Wang et al. |
| 2002/0071756 A1 | | 6/2002 | Gonzalez |

FOREIGN PATENT DOCUMENTS

| | | |
|---|---|---|
| EP | 0 821 403 | 1/1998 |
| GB | 2 199 022 | 6/1988 |
| JP | 63-136532 | 8/1988 |
| JP | 10-163297 | 6/1998 |
| WO | WO 98/01890 | 1/1998 |
| WO | WO 99/18601 | 4/1999 |

OTHER PUBLICATIONS

"Asyst Axys 407 Class 1 Robot", Asyst Technologies, Inc., Mar. 2000.

"Asyst Model 53 Robot," Asyst Technologies, Inc. 2002.

"4.5 Vacuum Robot," Asyste Technologies, Inc. 2002.

"Provisional mechanical specification for a 300 mm single-wafer box system that emulates a foup," SEMI E103-1000 2000, pp. 1-4.

"Edge Gripping End-Effector," www.ideworld.com, Jul. 24, 2002.

* cited by examiner

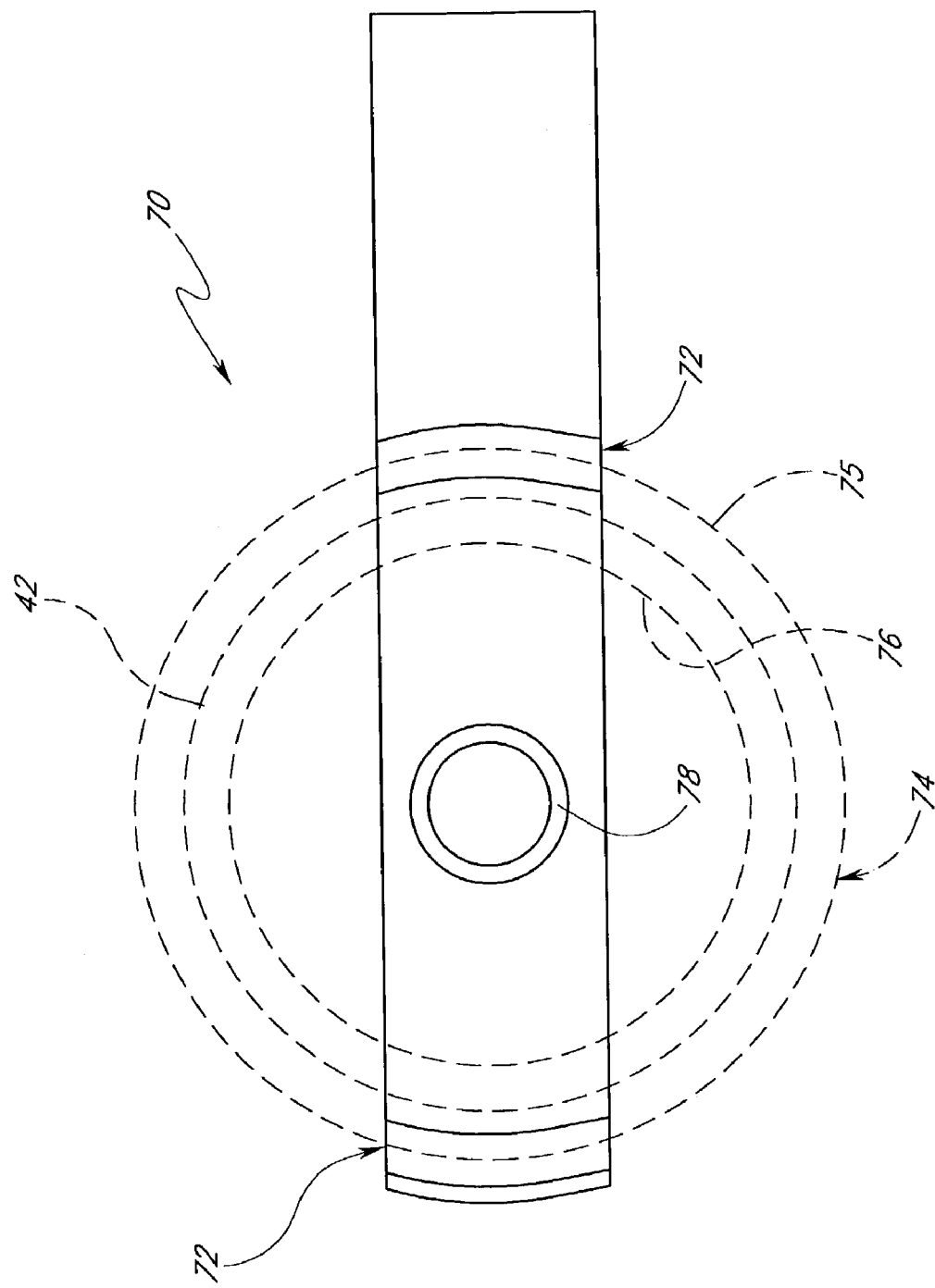

TWO LEVEL END EFFECTOR

REFERENCE TO RELATED APPLICATIONS

This application claims the priority benefit under 35 U.S.C. § 119(e) of U.S. provisional application No. 60/377,904, filed May 2, 2002. Additionally, this application claims the priority benefit under 35 U.S.C. § 119(e) of U.S. provisional application No. 60/365,122, filed Mar. 15, 2002 and U.S. Provisional application No. 60/379,885, filed May 10, 2002.

FIELD OF THE INVENTION

The invention relates to the transfer of articles, such as semiconductor wafers and more particularly to an improved end effector for handling and transferring of wafers.

BACKGROUND AND SUMMARY OF THE INVENTION

For the batch processing of wafers in vertical furnaces at very high temperatures it is proposed in U.S. provisional application No. 60/365,122, filed Mar. 15, 2002 (incorporated herein by reference) to support wafers, accommodated in a wafer boat, by susceptor plates. A susceptor plate supports a wafer over its entire surface to prevent slip of the wafer during the high temperature processing. Loading/unloading of wafers into a wafer boat with susceptor plates can be carried out according to the loading/unloading procedure described in the above reference application. The '122 application proposes to have the susceptor plates removably accommodated in the wafer boat. In the loading procedure, a wafer is transported by a wafer handling robot to a transfer station where it is placed onto a susceptor plate. The susceptor plate, accommodating the wafer on its upper surface, is transported from the transfer station to the wafer boat by the wafer handling robot. The susceptor plates are contacted by the same generic end effector as the wafers.

Susceptor plates used for high temperature applications are generally made from silicon carbide (SiC). A common problem of a SiC-object is its surface roughness. The contact surface of the end effector can be damaged by the rough surface of the susceptor plate and subsequently is a potential source for damaging wafers handled by this end effector.

One way to avoid damage of the wafer is to use two end effectors instead of one end effector. The first end effector is used to handle semiconductor wafers and the second end effector is used to handle susceptor plates. Extra space inside the semiconductor processing tool would be needed to accommodate a second end effector. The space necessary is not always available and, when available, could be more productively employed in other fashions. Furthermore, the logistics of such a solution are very complex.

Hence, it is an object of the present invention to provide a single end effector that is able to handle susceptor plates and wafers, desirably without the susceptor plate ever touching the contact surface of said end effector on which the wafer is to be supported.

According to one aspect of the invention, an end effector is provided with a first contact surface to support a semiconductor wafer and a second contact surface, displaced relative to the first contact surface, to support a susceptor plate. Preferably, the first contact surface is on a first vertical level and the second contact surface is on a second vertical level.

According to one embodiment, the second surface (for supporting the susceptor plate) is positioned below the first surface. The susceptor plate is provided with a recess in an underside thereof, configured to prevent contact with said first contact surface while the susceptor plate is supported by the second contact surface. The recess faces the first contact surface and has a diameter significantly smaller than the outer diameter of the second contact surface but a large enough to accommodate the first contact surface. The depth of the recess is such that no contact of the susceptor plate is made with the first contact surface while it is supported by the second contact surface.

In another embodiment, an edge support end effector supports a disk-like object at a contact surface at the edge of the object. With this edge support end effector, a wafer is supported at a first, lower level and a susceptor plate with a larger diameter than the wafer is supported at a second higher level. The contact surface can be upwardly and outwardly sloped so that the object to be supported is only contacted at its outer edge. In another embodiment, the contact surface can also comprise steps.

BRIEF DESCRIPTION OF THE DRAWINGS

FIG. 9C is a top plan view of another end effector, configured to support a wafer upon an inner ring and a susceptor ring upon outer discontinuous pads.

DETAILED DESCRIPTION OF THE PREFERRED EMBODIMENTS

According to preferred embodiments of the invention, an end effector is provided with a first contact surface to support a semiconductor wafer and a second contact surface, displaced relative to the first contact surface, to support a susceptor plate. The second contact surface can be laterally displaced relative to the first contact surface. Typically, the susceptor plate has a diameter slightly larger than the wafer. In this case, the wafer can be supported by a first contact surface being disposed within a peripheral edge of the wafer and the susceptor plate can be supported on a second contact surface, positioned outside a peripheral edge of the wafer but positioned within a peripheral edge of the susceptor plate. The second surface is also preferably positioned vertically displaced with respect to the first surface.

In one embodiment, the susceptor plate, supported by the second contact surface, contains a recess to prevent contact of the susceptor plate with the first contact surface. The recess faces the first contact surface and is sized to accommodate the first contact surface. The depth of the recess is such that the susceptor plate makes no contact with the first contact surface while the susceptor is supported by the second contact or support surface. In this case, the first contact surface is vertically above the second contact surface.

Figure 1:
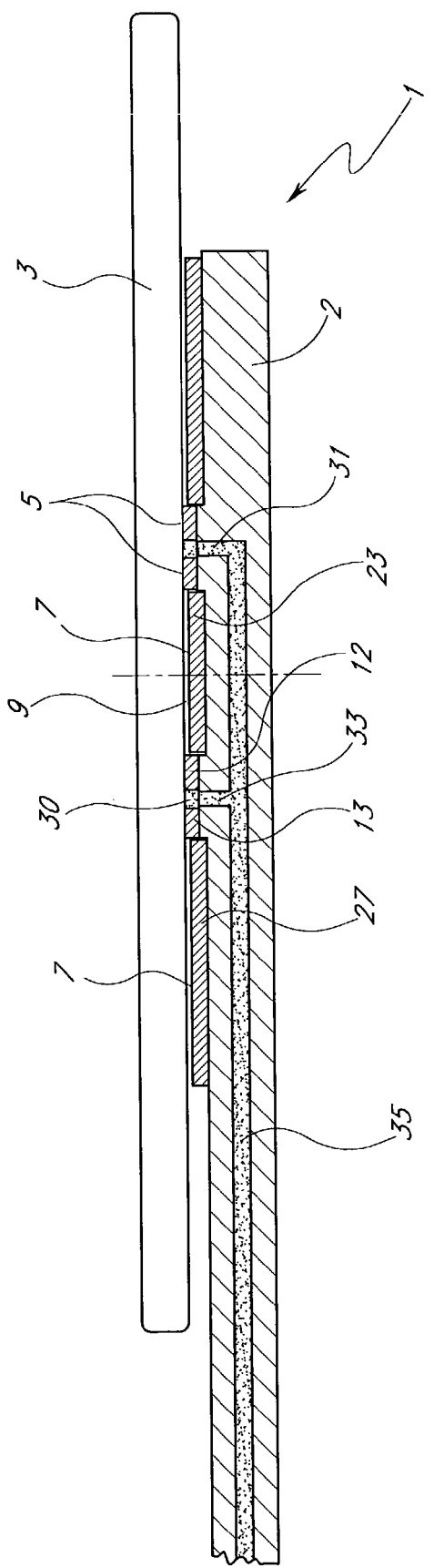
FIG. 1 is a cross-sectional side view of the tip of an end effector constructed in accordance with a first preferred embodiment of the invention, shown supporting a wafer.

In FIG. 1 a cross-sectional side view of the tip of an end effector 1 is shown. The body 2 of the end effector 1 is made of stainless steel, alumina or any other suitable construction material. Inner annular rings 12 and 13 are disposed on the body 2. The top surfaces of the inner rings 12, 13 provide a first contact surface 5 at a first level to support a wafer. The inner rings 12 and 13 are preferable formed of a relatively soft material, such as TEFLON™, PEEK, polyethylene, polypropylene or any other suitable material that does not flake and does not damage the wafer upon contact. An annular groove 30 is provided and connected to a vacuum channel 35 through connection channels 31 and 33. The vacuum channel 35, in turn, is connected to a vacuum pump (not shown). By evacuating the groove 30, a wafer 3 is secured onto the end effector 1 so that movement of the wafer during transport is prevented. The top surfaces of a disc 23 and an outer ring 27 provide a second contact surface 7 to support a susceptor plate 4, as shown in more detail in FIG. 2. The second contact surface 7 is vertically displaced from the first contact surface 5 by a distance ΔH. Preferably, the second surface 7 is positioned below the first surface 5.

Figure 2:
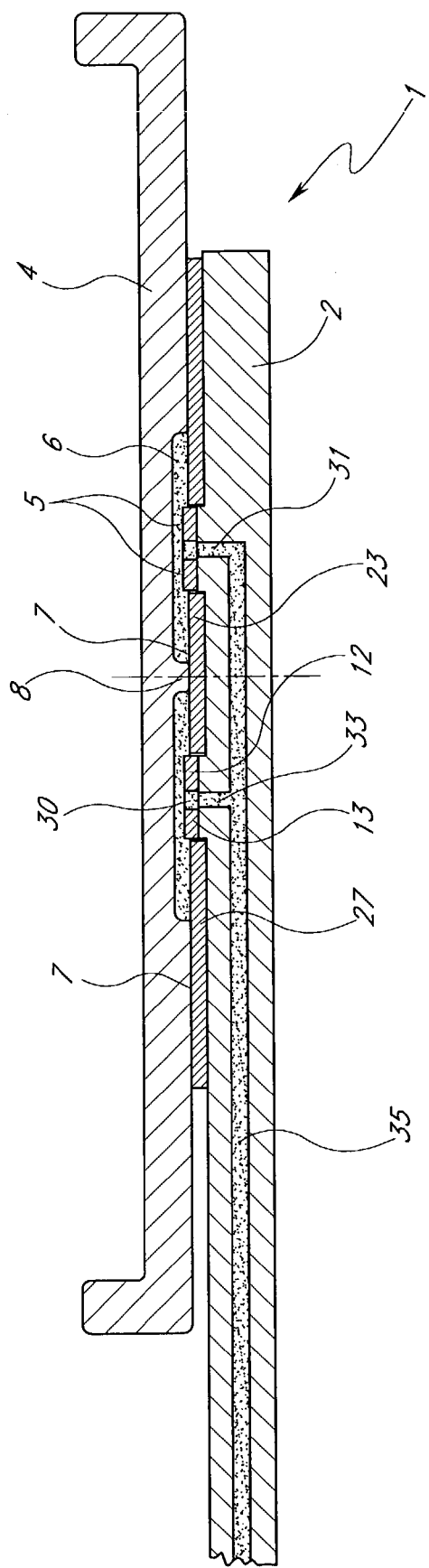
FIG. 2 is a cross-sectional side view of the tip of the end effector of FIG. 1, shown supporting a susceptor plate within a recess in the lower surface of the susceptor plate.

FIG. 2 shows a cross-sectional side view of the same end effector 1 as shown in FIG. 1, but in this view the end effector 1 is shown supporting a susceptor plate 4 on the second contact surface 7 at a second level. The susceptor plate 4 comprises an annular recess 6 having a pin 8 depending from the lower surface thereof at its center. The pin 8 is supported by the upper surface of the central disc 23. By applying vacuum to the groove 30, the free volume in the recess 6 will be evacuated so that susceptor plate 4 is secured to the end effector 1 and shift of the susceptor plate 4 during movement is prevented. Advantageously, the recess 6 has a depth D. As illustrated, D>ΔH, such that the susceptor plate 4 does not contact the first contact surface 5, which is reserved for support of the wafer 3 (see FIG. 1).

Figure 3:
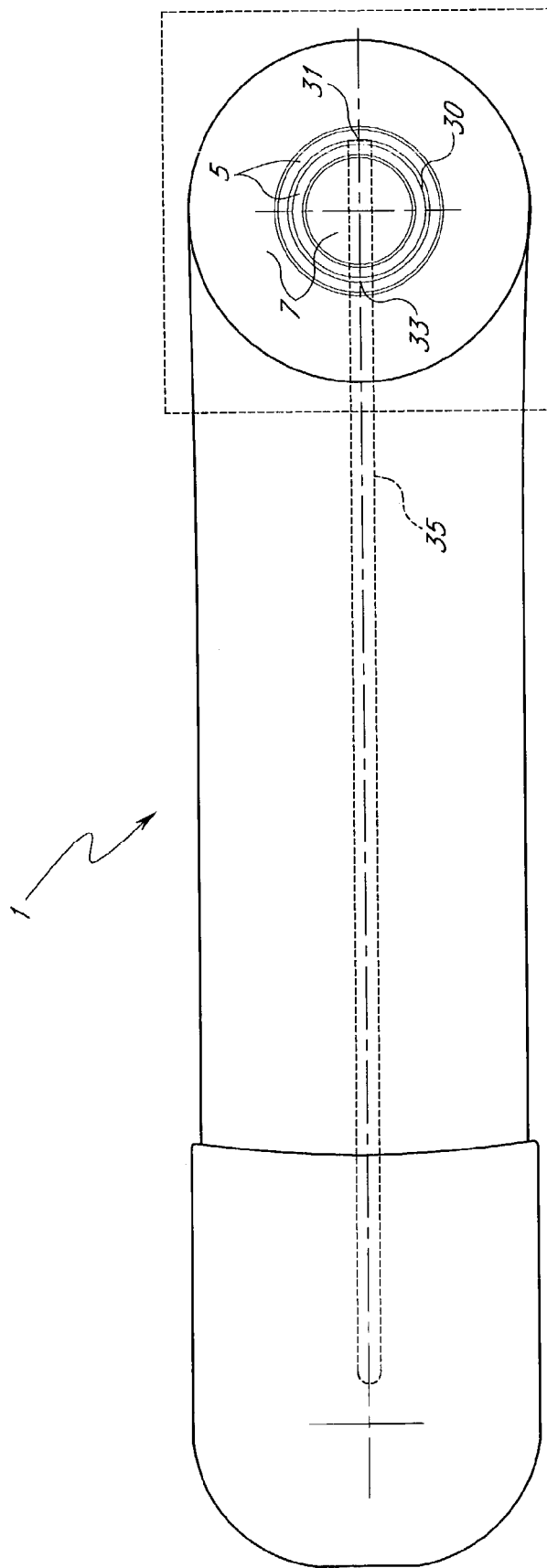
FIG. 3 is a cross-sectional plan view of the end effector of FIG. 1.

In FIG. 3 a cross-sectional plan view of the end effector 1 in its entirety is presented, wherein like numbers refer to similar elements. The annular groove 30 is shown connected to a vacuum line 35 via opening 31 and opening 33.

Figure 4:
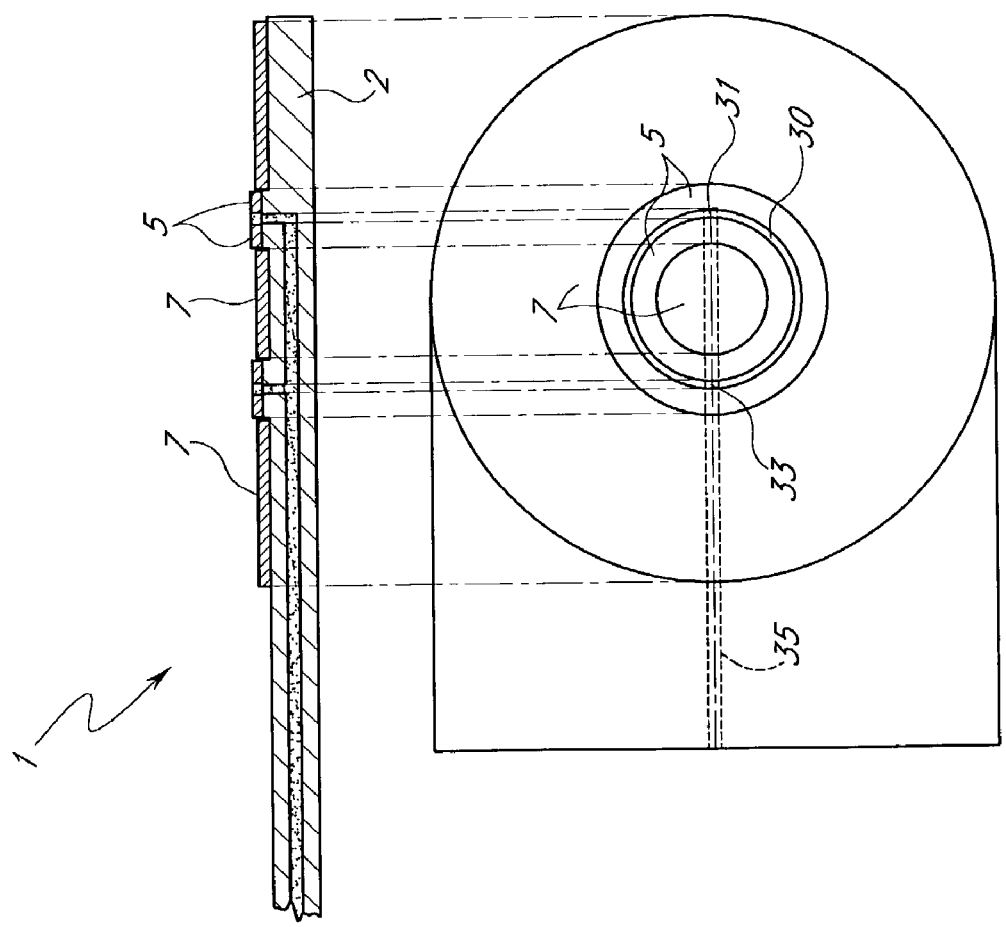
FIG. 4 is a cross-sectional side view and a cross-sectional plan view of the tip of the end effector of FIG. 3.

A blow-up of the area inside the dotted line of FIG. 3 is shown in FIG. 4. These cross-sectional side and top views of the end effector 1 show the relation between side cross section and top view. The first contact surface 5 is shown at a first level to support the semiconductor wafer 3 and the second contact surface 7 is shown at a second level to support the susceptor plate 4. The second contact surface is positioned below the first contact surface.

As mentioned above, the inner rings 12 and 13 of the end effector 1 are preferably formed of a relatively soft material to avoid damaging of a wafer during transfer. Unfortunately, such a material scratches very easily. If a scratch in the radial direction is present on the contact surface of the inner ring 12, connecting the annular groove 30 and the free volume 9 located above the disc 23, an unwanted vacuum in free volume 9 will be created when evacuating the groove 30. Firstly, the unwanted vacuum results in large forces on the wafer 3, resulting in bending of the wafer, which is undesirable. Secondly, during release of the wafer it will take a relatively long time before the vacuum in the relatively large free volume 9 is filled to atmospheric pressure again. This delay would cause unwanted sticking of the wafer 3 onto the first contact surface 5 and in uncontrollable and abrupt release of the wafer, which may induce damage and inaccurate positioning of the wafer in the wafer cassette.

Figure 5:
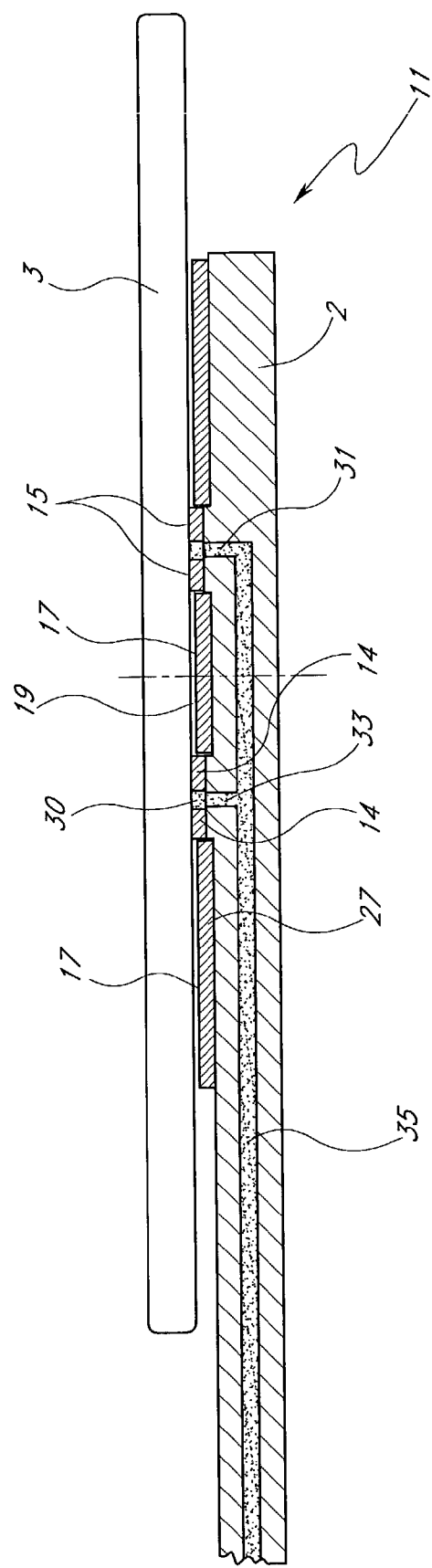
FIG. 5 is a cross-sectional side view of the tip of an end effector with a C-shaped first contact surface, constructed in accordance with a second embodiment of the invention, shown supporting a wafer.
Figure 6:
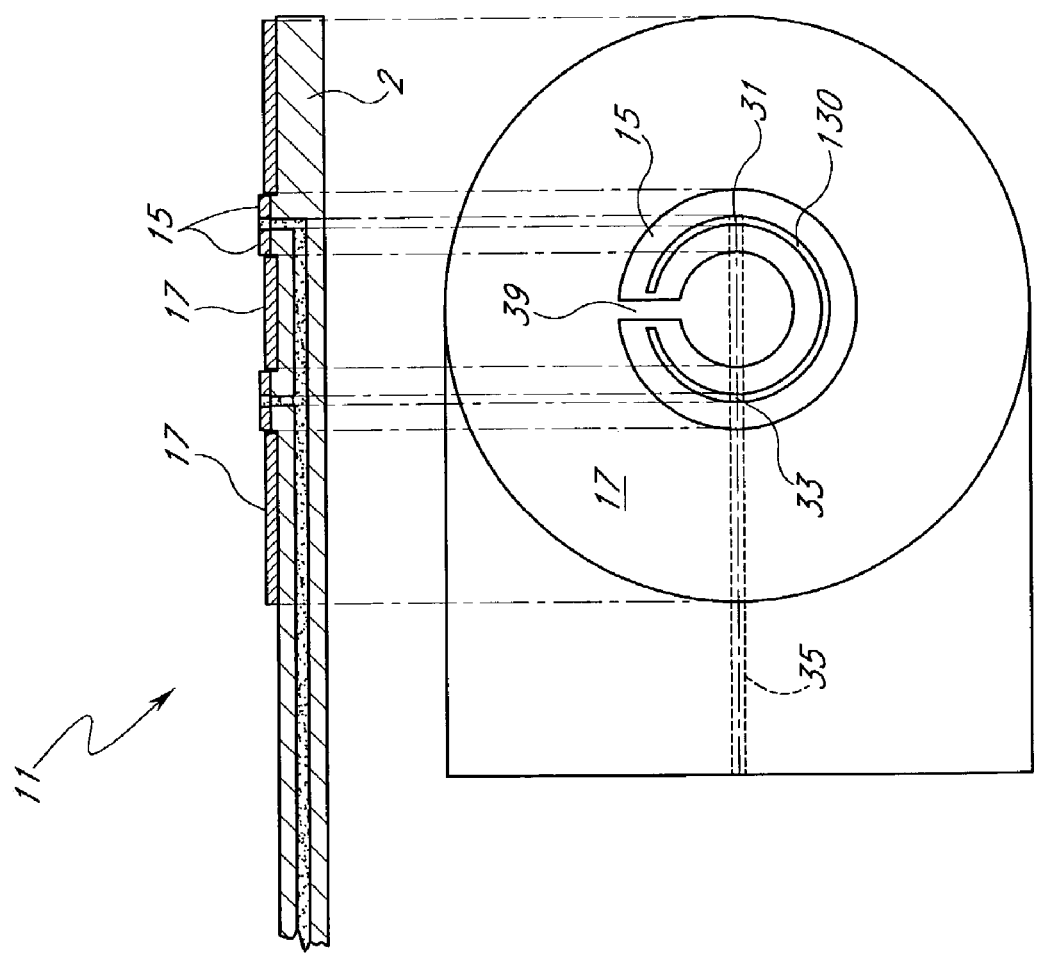
FIG. 6 is a cross-sectional side view and a cross-sectional plan view of the tip of the end effector of FIG. 5.

With reference to FIGS. 5 and 6, in order to prevent these problems from occurring, the inner annular rings 12 and 13 and the annular groove 30 (FIGS. 1–4) are replaced by a C-shaped ring 14, disposed on the body 2 providing a first contact surface 15 at a first level to support a wafer 3. The top surface of the support pad 27 provides a second contact surface 17 to support a susceptor plate (not shown). Entirely enclosed by the first contact surface 15 of the C-shaped ring 14 is a C-shaped groove 34 which is connected to the vacuum channel 35 through the connection channels 31 and 33. The C-shaped ring 14 leaves open a passage 39 that connects a free volume 19 with the outer atmospheric environment, where the free volume 19 is defined by the wafer 3, the disc 23 and the ring 14.

Figure 7:
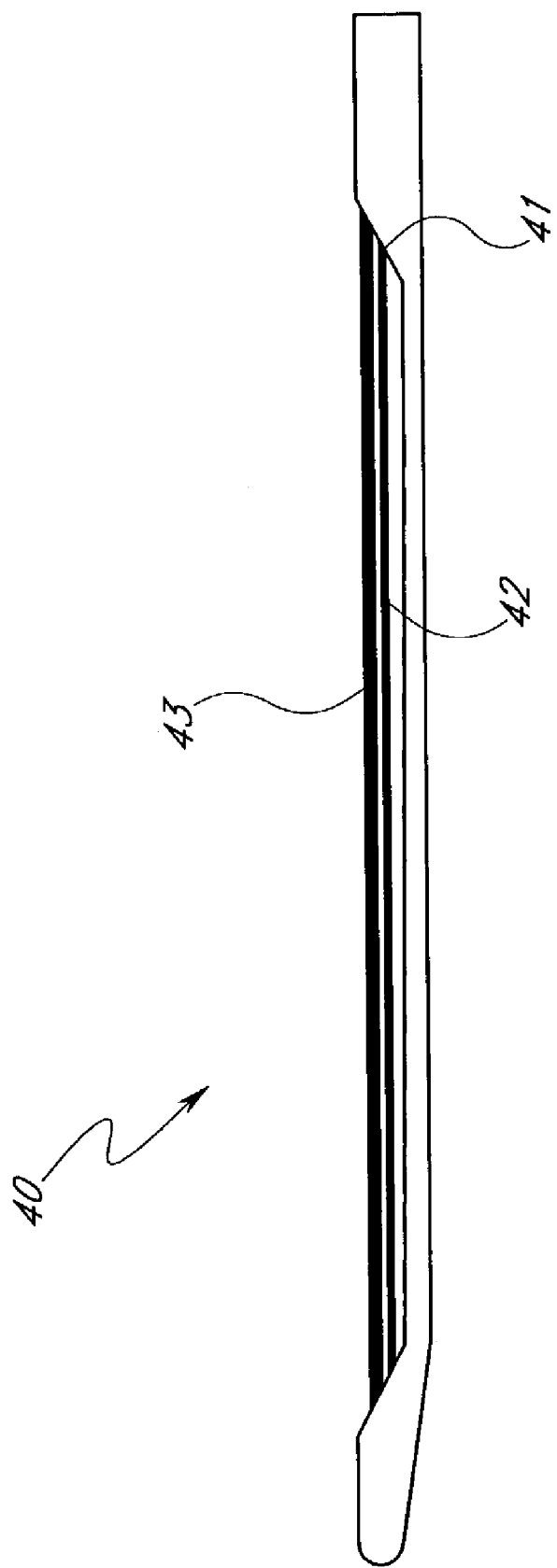
FIG. 7 is a cross-sectional side view of an edge support end effector in accordance with a third embodiment of the invention, with a sloped contact surface supporting a wafer and susceptor plate.

With reference now to FIG. 7, in a third embodiment, an edge support end effector 40 is presented as an alternative to prevent damage of a wafer. In FIG. 7 a cross-sectional view of an edge support end effector 40 is provided with an arcuate contact surface 41 near the wafer edge. The contact surface 41 preferably conforms to an annulus that slopes upwardly and outwardly. With this edge support end effector 40, a wafer 42 is supported at a first, lower level and a susceptor plate 43 with a larger diameter than the wafer is supported at a second, higher level. The susceptor or support plate 43 thus does not touch portions of the contact surface 41 that support the wafer 42, and the wafer 42 does not touch portions of the contact surface 41 that support the susceptor plate 43. The skilled artisan will appreciate that the susceptor plate 43 and wafer 42 can be separately transported in operation, as described below.

Figure 8:
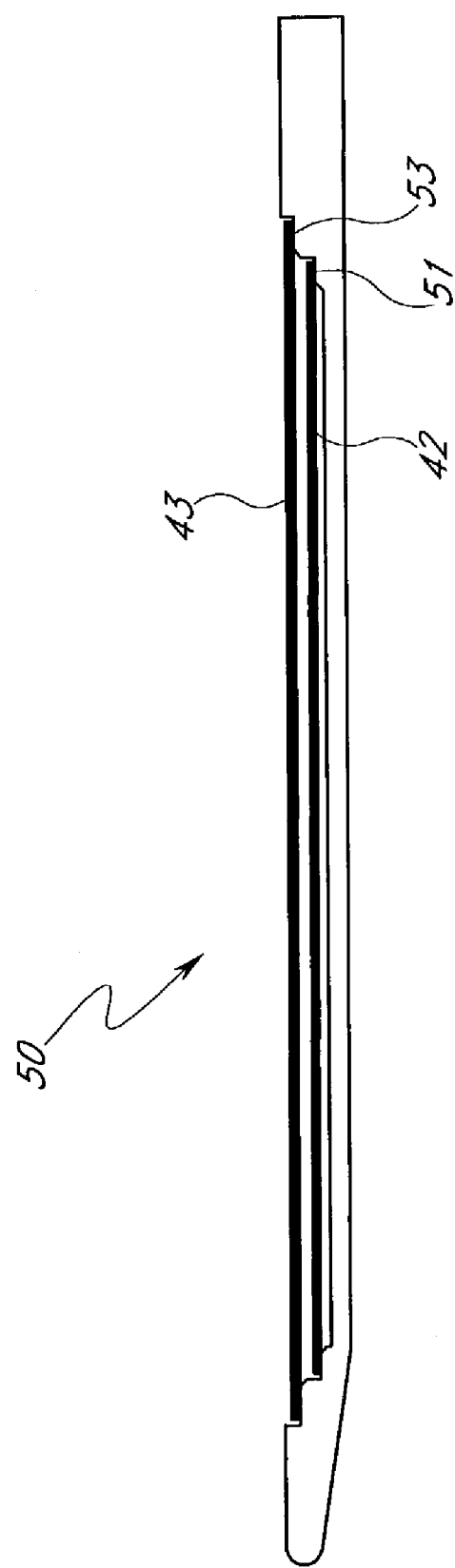
FIG. 8 is a cross-sectional side view of an edge support end effector with a first arcuate contact surface to support a wafer at first level and second arcuate contact surface to support susceptor plate at second level, in accordance with a fourth embodiment of the invention.

FIG. 8 illustrates a variation of the edge support end effector 40 of FIG. 7. The edge support end effector 50 comprises a first arcuate platform 51 defining the first contact surface at a first, lower level to support the edge of a wafer 42 and a second arcuate platform 53 at a second, higher level to support the edge of a susceptor plate 43. The second platform 53 has an inner diameter slightly larger than the wafer 42, as can be seen in FIG. 8. Each of the platforms 51, 53 preferably conforms to an annulus.

While not shown, it will be understood that the end effectors 40, 50 of FIGS. 7 and 8 can be larger than the wafer and susceptor plate such that the contact surfaces 41, 51 and 53 can be completely annular. More preferably, however, the contact surfaces of each of the embodiments of FIGS. 7 and 8 are formed by discontinuous arcuate pads conforming to the shape of a ring that has an inner diameter smaller than the outer diameter of the object to be carried and an outer diameter larger than the outer diameter of the object to be carried.

Figure 9A:
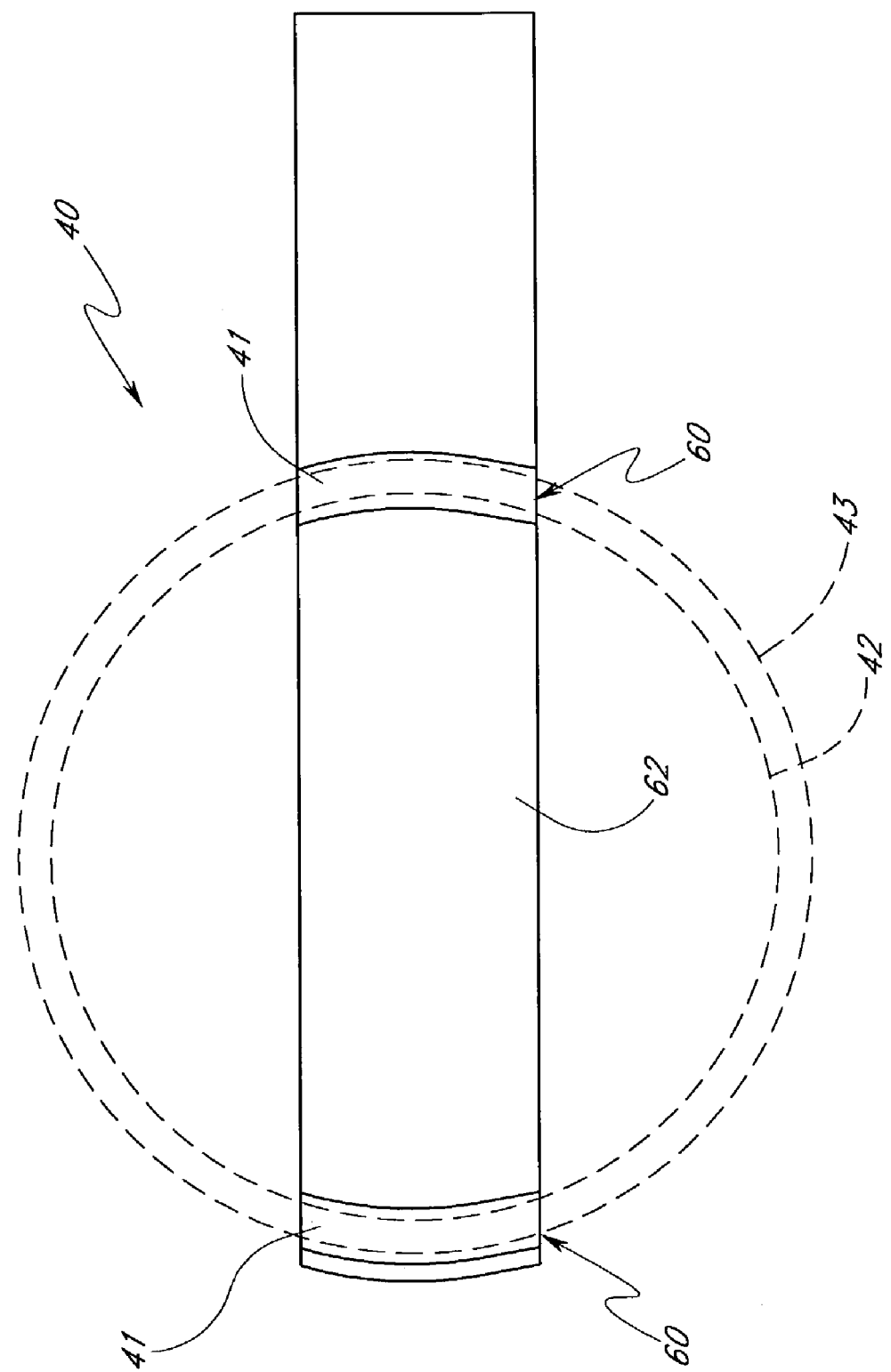
FIG. 9A is a top plan view of one arrangement of the effector of FIG. 7.

FIG. 9A shows the end effector 40 of FIG. 7 in plan view, in accordance with preferred arrangements. As illustrated, in each arrangement the sloped contact surface 41 is formed by a plurality of pads 60. The discontinuous arcuate pads 60 are formed on or extend from a paddle or wand 62 that is narrower than either the wafer 42 or the susceptor plate 43.

Figure 9B:
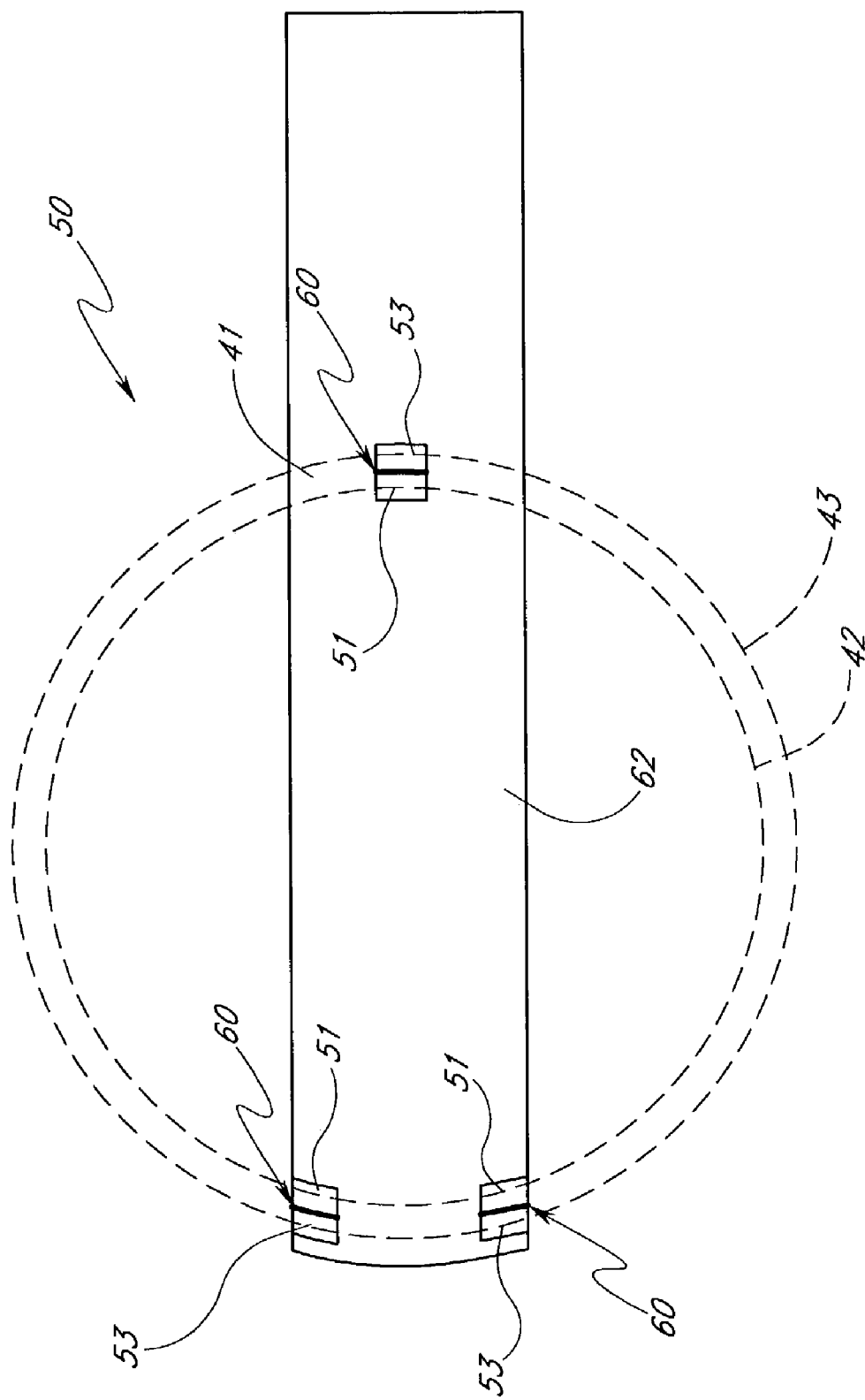
FIG. 9B is a top plan view of another arrangement of the end effector of FIG. 8.

FIG. 9B shows the end effector 50 of FIG. 8 in plan view, in accordance with a preferred arrangement. As illustrated, each of the first platform 51 and second platform 53 are formed by steps on discontinuous arcuate pads 60 (three illustrated), where each of the steps falls on a common annulus with the corresponding steps of the plurality of pads 60. The pads 60 are formed on or extend from a paddle or wand 62 that is narrower than either the wafer 42 or susceptor 43, both shown in phantom.

In this manner, the end effector 40 or 50 can fit between the posts of a standard cassette designed to support wafers 42, or the cassette disclosed in U.S. Provisional Patent Application No. 60/365,122, filed Mar. 15, 2002, which is designed to support a plurality of susceptor plates 43. U.S. Provisional Application No. 60/365,122, filed Mar. 15, 2002 is incorporated herein by reference. It will be understood that the stepped platforms of FIG. 8 can similarly be formed on discontinuous pads. The contact surfaces 41, 51, 53 of either FIG. 7 or FIG. 8 preferably conform to annular surfaces but do not necessarily define a continuous annulus.

FIG. 9C illustrates a different arrangement of an end effector 70 for the support of wafers and susceptor or support rings. In the illustrated embodiment, discontinuous arcuate pads 72 are provided for supporting a support ring 74, which has an outer diameter 75 and an inner diameter 76, shown in phantom. Additionally, a wafer contact surface 78, illustrated in the form of an inner support ring, is provided for separately supporting a wafer 42. The arcuate pads 72 are configured for edge support of the support ring 74 and illustrated as conforming to a sloped surface. The pads 72 are sized and shaped to have an inner diameter smaller than the outer diameter 75 of the support ring 74 but larger than the diameter of the wafer 42. The wafer contact surface 78 has an outer diameter smaller than the inner diameter 76 of the support ring 74. Thus, when a wafer 42 is supported upon the inner wafer contact surface 78, the wafer 42 does not touch the susceptor contact surfaces of the arcuate pads 72. Conversely, when a susceptor ring 74 is supported upon the arcuate pads 72, the susceptor ring 74 does not contact the inner wafer contact surface 78.

The end effectors disclosed herein are particularly useful for transporting susceptors to a transshipment or transfer station designed for loading wafers onto susceptors for transporting the wafer susceptor combination together into a boat for batch processing, and for transporting wafers on the same end effector to the transfer station.

Figure 10:
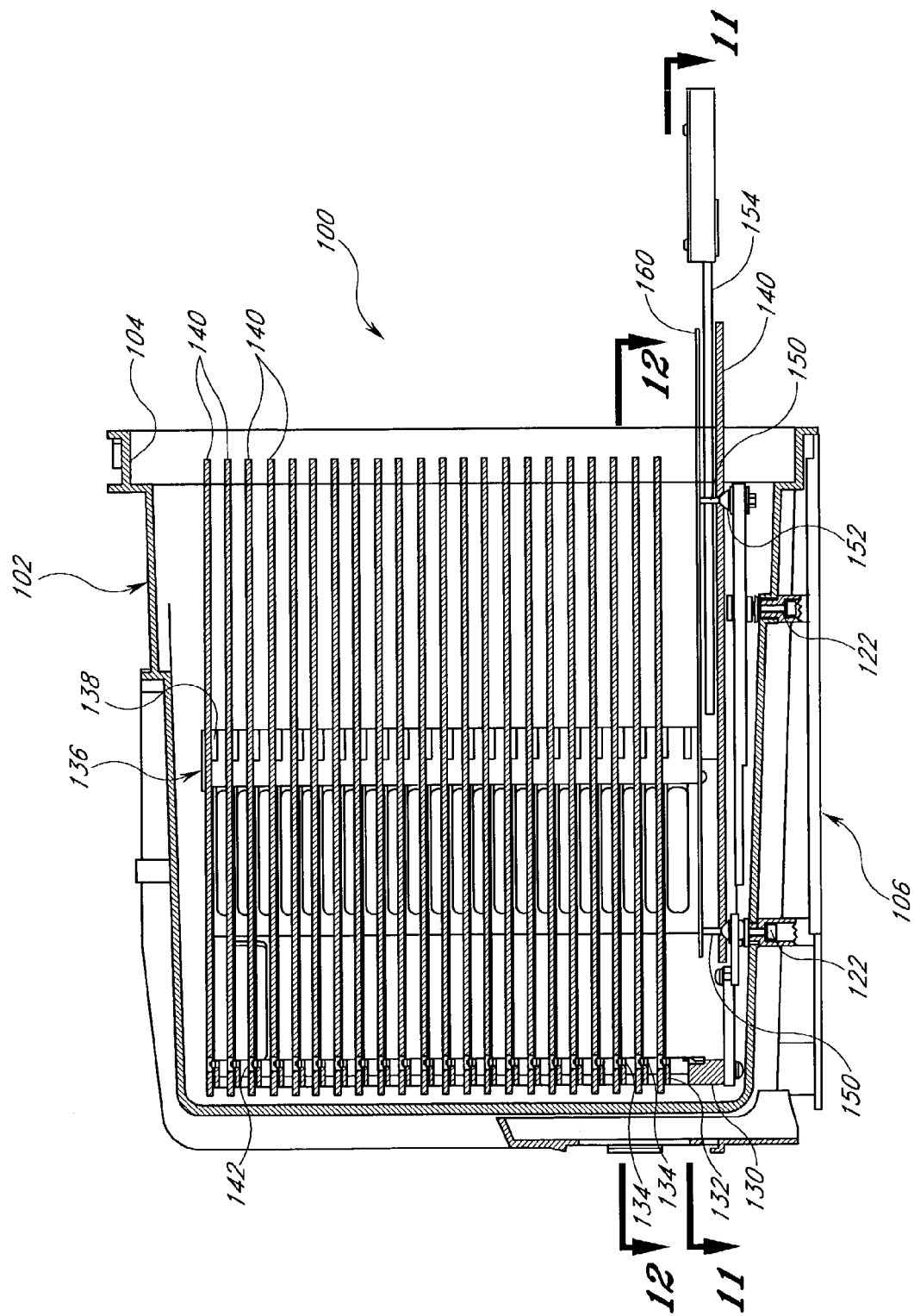
FIG. 10 is a cross-sectional side view of a support plate FOUP comprising a transfer station for use with the preferred end effectors.
Figure 11:
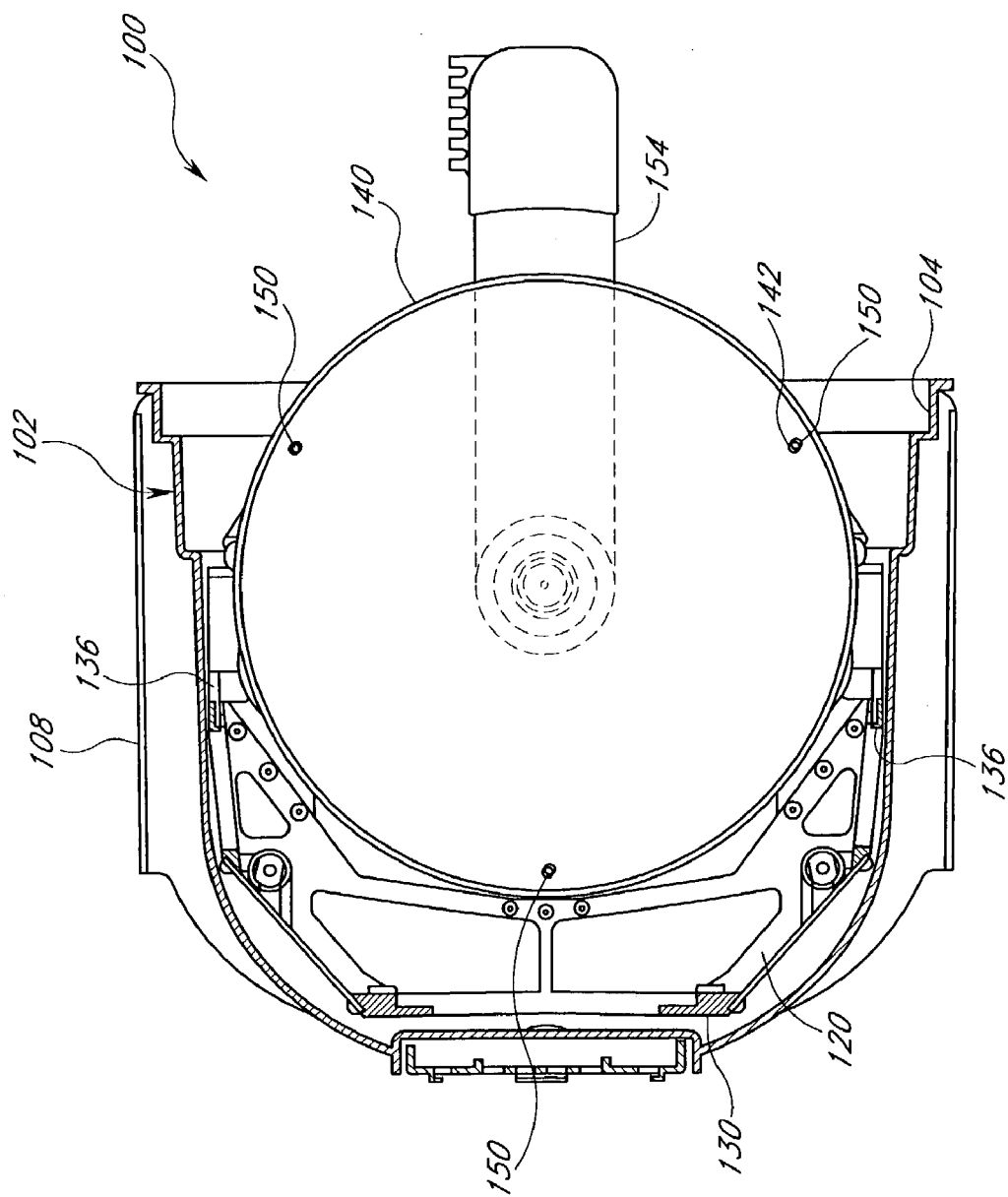
FIG. 11 is a cross-sectional top view of a support plate FOUP of FIG. 10, shown with a support plate at the transfer station, taken along lines 11—11 of FIG. 10.
Figure 12:
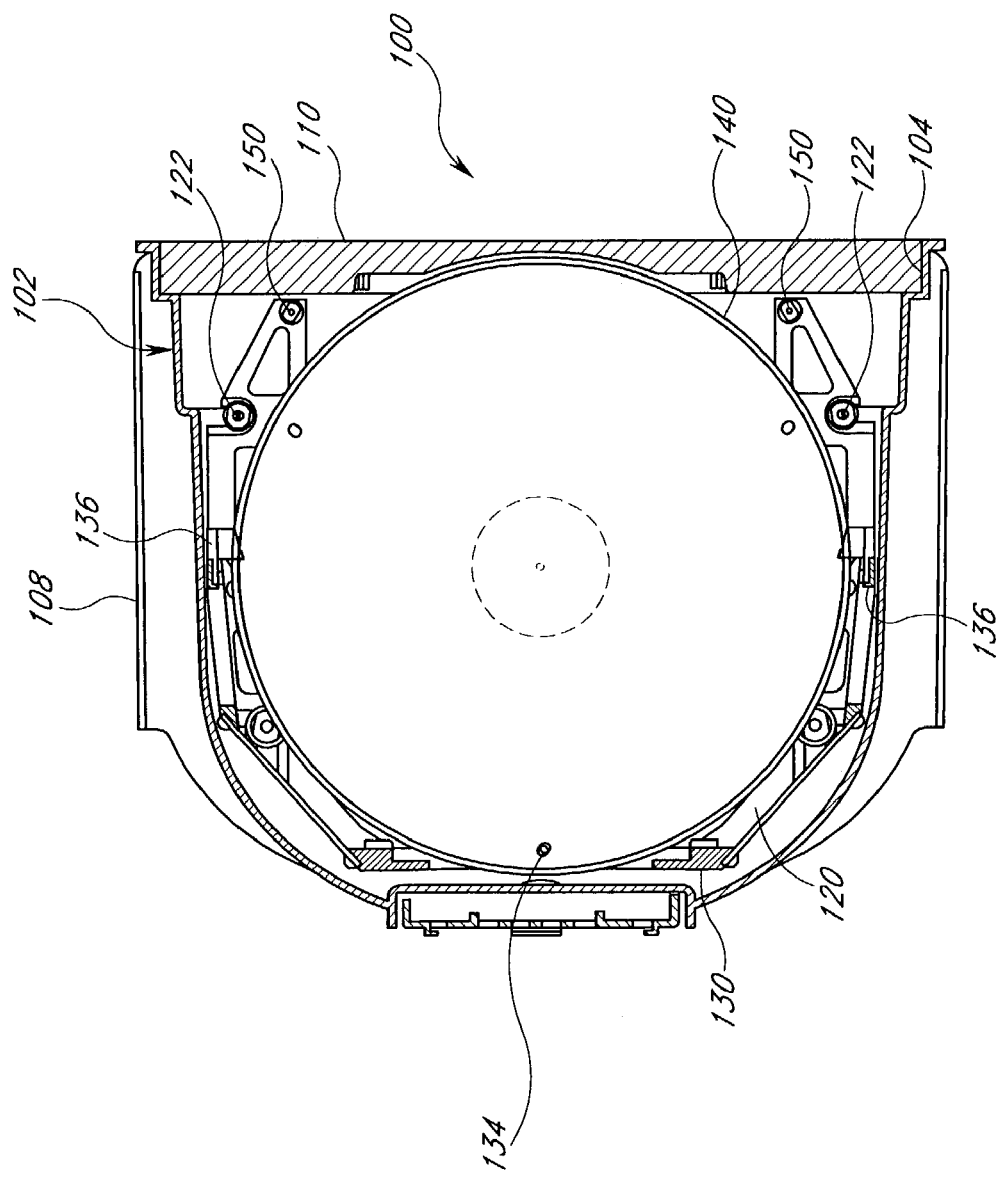
FIG. 12 is a cross-sectional top view of the support plate FOUP of FIG. 10, shown in a closed position, taken along lines 12—12 of FIG. 10.

FIGS. 10–12 illustrate the transfer station of U.S. Provisional Application No. 60/365,122, filed Mar. 15, 2002. As described therein, a transfer station is positioned at the bottom of a cassette that is modified for storing susceptors. The transfer station is designed to allow loading and unloading of wafers onto and off of susceptor plates within the cassette-like structure. While not illustrated in FIGS. 10–12, the principles and advantages of the end effectors described herein are also applicable to susceptors that comprise support rings (see FIG. 9C) as described in U.S. Provisional Application No. 60/379,885, filed May 10, 2002, the disclosure of which is incorporated herein by reference.

In FIG. 10, a FOUP according to a preferred embodiment of the invention is represented in its entirety by reference numeral 100. The FOUP comprises a housing 102, which is provided at one end with a flange 104 to receive a door 110 (FIG. 12). At the bottom, a mechanical interface 106 is provided for supporting the FOUP on a support table. Preferably, the outer surfaces of the FOUP 100, including the housing 102 and bottom interface 106, are configured in accordance with SEMI standards.

Inside the housing 102, a support structure 120 is provided, mounted at the lower side of the housing 102 with bolts 122. Attached to the support structure 100 are vertically extending support beams 130 and 136, provided with supports 132 and 138, respectively, to hold susceptors, which take the form of support plates 140 in the illustrated embodiment. Each support 132 is provided with a support ridge 134 with sloped sides, fitting in a hole 142 in a corresponding susceptor plate or support plate 140 to provide centering and positioning capabilities for the support plates 140. In total, 23 accommodations for support plates 140 are provided, of which the bottom one is shown empty in FIG. 10. As noted above, in other arrangements the susceptors can be support rings.

At the lower end of the FOUP 100, where two more slots are ordinarily found in standard cassettes designed for accommodating 25 wafers, a transshipment or transfer station is provided. The transfer station comprises three pins 150, each provided with a conical lower end 152, on which a susceptor or support plate 140 can be supported, and a cylindrical upper part, on top of which a wafer 160 can be supported. Preferably the material of the pins 150 is PEEK® or any other material that is not damaging the wafer, like Teflon™ or polypropylene. Each support plate 140 is provided with three holes 142 to accommodate the cylindrical upper part of the pins 150.

In order to load a wafer onto a support plate, a robot end effector 154 contacts a support plate in one of the storage accommodations of the FOUP 100 from the bottom and the robot transports the support plate from the storage accommodation to the transfer station provided at the lower end of the FOUP 100. The end effector 154 is configured, as described above, to have wafer supporting surfaces and separate susceptor supporting surfaces. The robot holds a support plate 140 upon susceptor contact surfaces such that the support plate does not touch the wafer contact surfaces, and places the support plate at the conical part 152 of the support pins 150. Because the position of the support plates is locked in the storage accommodations, through support ridges 134, it is ensured that the orientation of the support plates is correct, such that the position of the holes 142 in the support plate 140 corresponds with the positions of the pins 150.

Then a wafer 160 is transported upon wafer contact surfaces of the robot end effector to the transfer station and is placed on top of the pins 150. Desirably, the wafer 160 does not touch the susceptor contact surfaces of the robot end effector. Next, the robot retracts, moves downward and extends again so that the end effector 154 is now placed below the support plate 140 that is positioned on the pins 150. Finally, the end effector 154 moves upward until the support plate 140 is lifted from and raised above the pins 150, the wafer 160 is supported by the support plate 140 and the wafer/plate combination is raised above pins 150. Then the robot can transport the support plate 140 upon susceptor contact surfaces of the end effector, together with the wafer 160, to the support plate holder or boat (not shown).

In FIG. 11, a cross-sectional plan view of the FOUP 100 is shown with a support plate 140 at the transfer station resting on the pins 150, and the end effector 154 present below the support plate 140. A mechanical side interface is indicated by reference numeral 108. The transfer station is not positioned directly below the storage positions, but is instead displaced outwardly. In this way, the support plate 140 at the transfer position is sufficiently clear of the support beams 136 that the support plate 140 can be moved vertically during loading and unloading of the support plate 140 and wafer 160. A raised edge 144 of the support plate 140 shields the wafer edge against receiving excessive heat radiation during heat up, avoiding overheating of the wafer edge. Furthermore the raised edge 144 prevents the wafer from moving horizontally during transport of the support plate 140 with a wafer thereon.

In FIG. 12, a cross-sectional top view is shown with the door 110 of the FOUP 100 in a closed position. It can be seen that the support plates 140 are locked in their stored orientations by support ridges 134, at the side opposite the door 110.

Although the transfer station is preferably provided at the lower end of the FOUP, it can be placed alternatively at the upper end or at a selected point between the upper and lower ends.

As an alternative to use with the transfer station of FIGS. 10–12, the end effectors disclosed herein with respect to FIGS. 1–9 can be used in conventional wafer processing equipment whereby a need exists to transfer susceptors and wafers upon the same end effector.

Advantageously, the end effectors disclosed herein are designed to avoid damage to the wafer supporting surfaces on the end effector. In particular, damage to the wafer supporting surfaces is avoided by transporting the susceptor on susceptor supporting surfaces of the same end effector in a manner that avoids susceptor plate contact with the wafer supporting surfaces.

It will be appreciated by those skilled in the art that various omissions, additions and modifications may be made to the structures and processes described above without departing from the scope of the invention. All such modifications and changes are intended to fall within the scope of the invention, as defined by the appended claims.

I claim:

1. An end effector for transporting susceptors and semiconductor substrates, comprising:
   a first contact surface configured for supporting a semiconductor substrate, wherein the first contact surface comprises all upwardly facing end effector surfaces for supporting the semiconductor substrate; and
   a second contact surface configured to support a susceptor, the second contact surface being displaced below the first contact surface, wherein the first contact surface is enclosed by a border substantially defined by an outer edge of the second contact surface, wherein the second contact surface is immobile relative to the first contact surface and wherein the first contact surface is sized and shaped to fit within a recess in the susceptor without contacting the susceptor.

2. The end effector of claim 1, wherein the first contact surface surrounds a recessed part, the recessed part connected to a vacuum source.

3. The end effector of claim 2, wherein the recessed part is a groove.

4. The end effector of claim 3, wherein the first contact surface is a C-shaped ring surrounding the groove, the groove also being C-shaped.

5. An end effector for transporting susceptors and semiconductor substrates, comprising:
   a first contact surface configured for supporting semiconductor substrates; and
   a second contact surface for supporting susceptors, the second contact surface being displaced below the first contact surface, wherein at least part of the second contact surface surrounds the first contact surface, wherein the second contact surface is immobile relative to the first contact surface, wherein the first contact surface surrounds a recessed part, the recessed part connected to a vacuum source, wherein the recessed part is a groove and wherein the first contact surface comprises a ring.

6. An end effector for transporting susceptors and semiconductor substrates, comprising:
   a first contact surface configured for supporting semiconductor substrates; and
   a second contact surface for supporting susceptors, the second contact surface being displaced below the first contact surface, wherein at least part of the second contact surface surrounds the first contact surface, wherein the second contact surface is immobile relative to the first contact surface, wherein the first contact surface surrounds a recessed part, the recessed part connected to a vacuum source, wherein the recessed part is a groove and wherein the first contact surface comprises two annular rings, separated by said groove.

7. An end effector for transporting susceptors and semiconductor substrates, comprising:
   a first contact surface configured for supporting semiconductor substrates; and
   a second contact surface for supporting susceptors, the second contact surface being displaced below the first contact surface, wherein at least part of the second contact surface surrounds the first contact surface, wherein the second contact surface is immobile relative to the first contact surface, wherein the second contact surface comprises a ring and wherein the second contact surface further comprises a central disk positioned concentrically within the ring.

8. The end effector of claim 7, wherein the first contact surface comprises an elevated ring positioned vertically spaced above and horizontally positioned between the second contact surface ring and the second contact surface central disk.

9. The end effector of claim 8, wherein the elevated ring comprises a C-shaped ring provided with a passage so that, when supporting a wafer on the elevated ring, a volume enclosed by the first contact surface elevated ring, the second contact surface disk and the wafer is in communication with a surrounding environment.

10. A system for transporting wafers and susceptors, comprising:
    an end effector having a first contact surface at a first level and a second contact surface at a second level vertically spaced below the first level, the first contact surface configured to support a wafer; and
    a susceptor configured to be supported upon the second contact surface without touching the first contact surface, the susceptor sized and shaped to receive the wafer, wherein the first contact surface is interior of a perimeter of the second contact surface and wherein the first contact surface is disposed at a constant position relative to the second contact surface.

11. The system of claim 10, wherein the first contact surface is configured to support the wafer without contact between the wafer and the second contact surface.

12. A system for transporting wafers and susceptors, comprising:
- an end effector having a first contact surface at a first level and a second contact surface at a second level vertically spaced from the first level, the first contact surface configured to support a wafer; and
- a susceptor configured to be supported upon the second contact surface without touching the first contact surface, the susceptor sized and shaped to receive the wafer, wherein the first contact surface is vertically displaced above the second contact surface, wherein the susceptor comprises a plate, which is configured with a recess having a size sufficient to accommodate the first contact surface therein while the susceptor plate is supported upon the second contact surface of the end effector, the recess having a depth greater than a vertical displacement between the first contact surface and the second contact surface.

* * * * *

UNITED STATES PATENT AND TRADEMARK OFFICE
CERTIFICATE OF CORRECTION

PATENT NO. : 7,104,578 B2 Page 1 of 1
APPLICATION NO. : 10/361480
DATED : September 12, 2006
INVENTOR(S) : Edwin Den Hartog It is certified that error appears in the above-identified patent and that said Letters Patent is hereby corrected as shown below:

Title Page Item [56] Column 2 (Other Publications); Line 2; Delete "1-10." and insert -- 1-10, 1997. -- therefor.

Signed and Sealed this

Ninth Day of January, 2007

JON W. DUDAS
*Director of the United States Patent and Trademark Office*